United States Patent [19]

Smith

[11] Patent Number: 5,442,508
[45] Date of Patent: Aug. 15, 1995

[54] GIANT MAGNETORESISTIVE REPRODUCE HEAD HAVING DUAL MAGNETORESISTIVE SENSOR

[75] Inventor: Neil Smith, San Diego, Calif.

[73] Assignee: Eastman Kodak Company, Rochester, N.Y.

[21] Appl. No.: 248,772

[22] Filed: May 25, 1994

[51] Int. Cl.⁶ ............................................. G11B 5/127
[52] U.S. Cl. ..................................................... 360/113
[58] Field of Search ........................................ 360/113

[56] References Cited

U.S. PATENT DOCUMENTS

| | | | |
|---|---|---|---|
| 5,084,794 | 1/1992 | Smith | 360/113 |
| 5,159,513 | 10/1992 | Dieny et al. | 360/113 |
| 5,168,760 | 12/1992 | Wun-Fogle et al. | 73/779 |
| 5,193,038 | 3/1993 | Smith | 360/113 |
| 5,206,590 | 4/1993 | Dieny et al. | 324/252 |
| 5,287,238 | 2/1994 | Baumgart | 360/113 |

OTHER PUBLICATIONS

T. L. Hylton et al, "Giant Magnetoresistance at Low Fields in Discontinuous NiFe-Ag Multilayer Thin Films", *Science*, vol. 261; pp. 1021–4, Aug. 20, 1993.

N. Smith et al, "Analysis of a Dual Magnetoresistive Head", *IEEE Trans. Mag.*, vol. 28, No. 5; pp. 2295–7, Sep. 1992.

N. Smith et al, "Micromagnetic Modeling of a Narrow-Track Dual Magnetoresistive Head", *IEEE Trans. Mag.*, vol. 30, No. 2, Mar. 1994.

*Primary Examiner*—A. J. Heinz
*Attorney, Agent, or Firm*—William F. Noval

[57] ABSTRACT

A giant magnetoresistance-dual magnetoresistance sensor or reproduce head (GMR-DMR) comprising multilayers of alternating magnetic and nonmagnetic thin film layers arranged such that sets of N sandwiched magnetic and nonmagnetic film layers are formed on either side of the center-most, conductive, nonmagnetic or magnetic film layer, whereby the layered structure operates in the fashion of a dual magnetoresistive sensor or reproduce head and exhibits giant magnetoresistance. Preferably the outer-most magnetic layers are of a thickness that differs from the remaining magnetic film layers in order to reduce self-bias level variance between the outermost and innermost magnetic film layers. Sense current flow through the GMR-DMR structure is induced by sensed magnetic fields and generated giant magnetoresistance changes are detected as head output voltage variations.

17 Claims, 9 Drawing Sheets

GIANT MAGNETORESISTIVE REPRODUCE HEAD HAVING DUAL MAGNETORESISTIVE SENSOR

CROSS-REFERENCE TO RELATED APPLICATION

Reference is hereby made to my commonly assigned, co-pending U.S. patent application Ser. Nos. 08/160,563, filed Dec. 1, 1993, and 08/208,755, filed Mar. 9, 1994.

BACKGROUND OF THE INVENTION

1. Field of the Invention

The present invention relates to a magnetic reproduce head, and in particular to a magnetoresistive reproduce head employing materials exhibiting giant magnetoresistance.

2 Description of the Prior Art

As magnetic recording technology continues to push areal recording density limits, magnetoresistive (MR) reproduce heads appear to be the technology of choice. Recent U.S. Pat. Nos. 5,084,794 and 5,193,038 (incorporated herein by reference) disclose dual magnetoresistive (DMR) reproduce heads which offer improved high linear density performance compared to conventional shielded magnetoresistive (SMR) heads, as well more robust operation and simpler fabrication. Until very recently, virtually all past magnetoresistive sensor/heads, including the DMR design, have been based on the physical phenomenon of anisotropic magnetoresistance (AMR) in Permalloy (NiFe) thin films.

The last few years have seen increased interest and research in the area known as "giant magnetoresistance" or GMR, which is a "giant" $\Delta R/R$ response that is markedly greater in magnitude than that obtained by the AMR effect and is described below. Films observed to exhibit giant magnetoresistance can consist of multilayers of very thin (roughly 20 Angstrom) ferromagnetic films alternating with similarly thin layers of non-magnetic conducting films typically of copper, silver, or gold.

The great potential of GMR films as magnetoresistive heads stems from the very large maximum change in resistance ($\Delta R/R$ as much as 10–20% in some systems) that they can exhibit in response to magnetic fields, as compared to the $\Delta R/R \approx 2\%$ typical of traditional MR films employing the usual anisotropic magnetoresistance (AMR) effect. In general, GMR films are in a high resistance state when the magnetization in the GMR multilayers are predominantly antiparallel in consecutive magnetic layers, and can be then brought to a low resistance state by the action of an applied field which rotates each layer's magnetization into a predominantly parallel orientation roughly along the applied field direction.

Excluding the special case of the trilayer "spin-valve" design with an additional exchange pinning layer as taught in U.S. Pat. Nos. 5,159,513 and 5,206,590, or the spin-valve-DMR taught in the above-reference Ser. No. 08/208,755 application, multilayers which exhibit GMR in response to external applied fields generally require some intrinsic mechanism (exchange or magnetostatic in origin) which produces an effective antiferromagnetic coupling between adjacent ferromagnetic layers in order to maintain the aforementioned antiparallel alignment in zero external field. The strength of this antiferromagnetic coupling is denoted in terms of the effective coupling field $H_{afc}$, which in most GMR multilayers is usually larger in magnitude than any existing uniaxial anisotropy of strength $H_k$.

Figure 1:
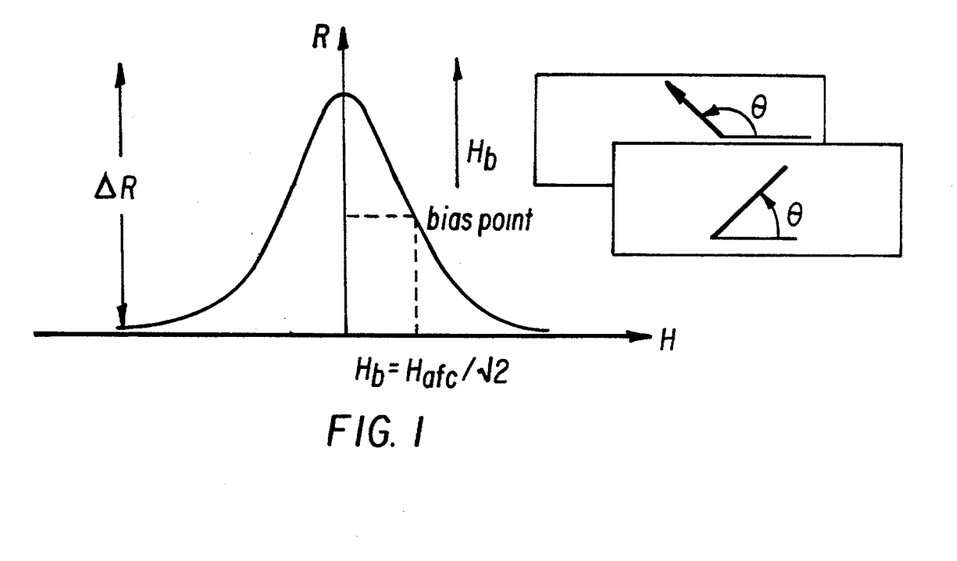
FIG. 1 is a sketch of the intrinsic R vs. H response curve (excluding any possible hysteresis) of a generic GMR multilayer, along with a sketch of the orientation angles of the magnetization of any two adjacent magnetic layers.
Figure 2:
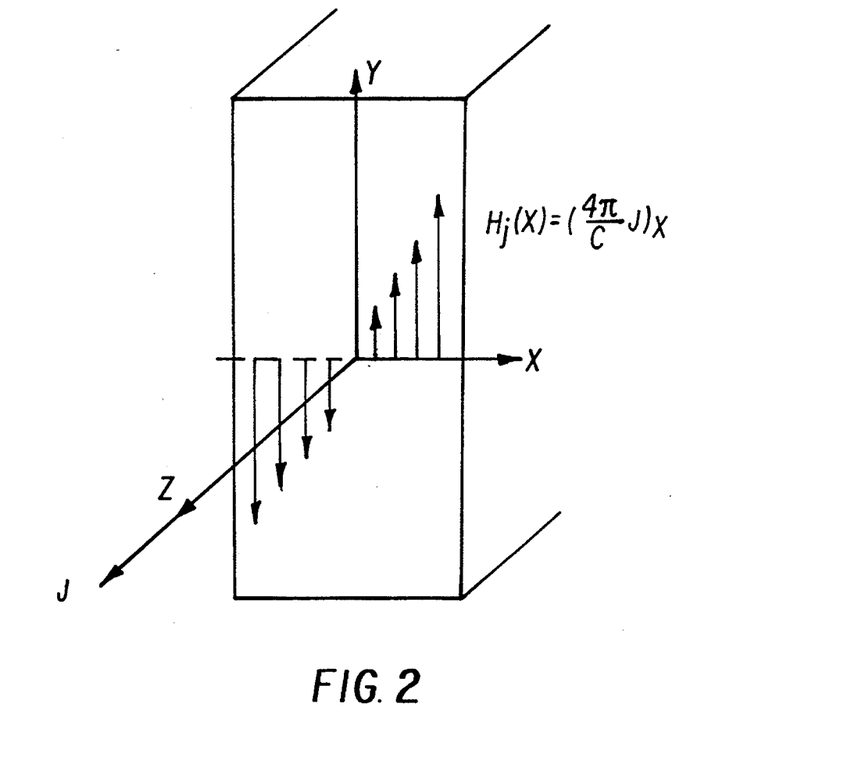
FIG. 2 is a sketch illustrating the spatial distribution of the internal magnetic field generated inside a thin film conductor carrying an approximately uniform current density.

The intrinsic resistance R vs. (hard axis) applied field H response curve of a generic GMR multilayer (excluding hysteresis, if any) is shown in FIG. 1. To obtain the optimal sensitivity dR/dH with maximum dynamic range, a GMR multilayer would be operated at the indicated bias point, requiring a bias field $H_b \approx (H_{afc}+H_k)/\sqrt{2} \approx H_{afc}/\sqrt{2}$ in order to rotate the magnetization angle by $\approx 45°$ such that $\sin\theta_b \approx 1/\sqrt{2}$. (For small, patterned GMR reproduce head elements, one should replace $H_k$ with $H_k+H_d$, where $H_d$ is the geometry dependent demagnetization field of the element, which can be quite large, e.g., 100–200 Oe.) Much recent work on GMR has been directed to the development of materials with low effective $H_{afc}$ and large $\Delta R/R$ in order to maximize the intrinsic sensitivity $\Delta R/R/H_{afc}$. To date, the largest value of the latter, with $\Delta R/R$ of 4–5% and $H_{afc}$ of 5–10 Oe, was reported by Hylton et al., reported in SCIENCE, vol. 261, pp. 1021–1024, Aug. 20, 1993. However, this and other reported R vs. H wafer level measurements of intrinsic $H_{afc}$ and $\Delta R/R$ are generally made at current densities which are minuscule compared to those that would exist in the actual micron sized GMR reproduce heads contemplated for the application of these GMR materials. FIG. 2 indicates the spatial distribution of the internal current field $H_j(x,y)$ generated in a thin film of total thickness, T, carrying a uniform current density J. To a good approximation, $H_j(x,y) \approx (2\pi/5) J \times$ Oe, with J in amp/cm$^2$.

The current field $H_j(x)$ is antisymmetric about the film center (x=0), i.e., $H_j(-x) = -H_j(x)$. This is of opposite symmetry to that of the uniform bias field $H_b$ of FIG. 1, or more generally, the symmetric component $H_{sig-s}(x,y) = [H_{sig}(x,y) + H_{sig}(-x,y)]/2$ of any signal field $H_{sig}(x,y)$ which such a uniformly biased GMR multilayer would be designed to measure using the teachings and practices of the current art. By itself, the current field $H_j(x)$ will induce an antisymmetric bias angle distribution $\sin\theta$ $j(x) \approx H_j(x)/H_{afc}$, which, it is important to note, is unimpeded by the size of $H_d$ because the antisymmetric $\sin\theta_j(x)$ averages to zero. When subsequently superimposed (possibly non-linearly) on the desired uniform bias distribution $\sin\theta_b \approx 1\sqrt{2}$, there will result an asymmetric $\theta$-distribution which can be skewed through the thickness of the GMR multilayer. In cases where $H_{j-max} = H_j(x=T/2) \geq H_{afc}$, there will likely occur substantial distortion of the internal GMR bias distribution in which opposite sides through the multilayer thickness will be substantially under biased ($|\sin\theta| << 12$) or saturated ($|\theta| \approx \pi/2$). Such bias distortion cannot be compensated for by any additional source of uniform (symmetric) bias field.

For future ultra high storage density applications, with sub-micron track widths, conventional AMR heads and/or spin-valve GMR designs will likely need to operate at current densities $J \geq 10^7$ amp/cm$^2$ to achieve adequate signal levels. Since reproduce signal scales directly with current density, GMR multilayer heads will need to operate at similar J if they are to take full advantage of their large intrinsic $\Delta R/R$. For a GMR multilayer of total thickness T=400 A, this corresponds to $H_{j-max} \geq 25$ Oe. It follows that such a GMR multilayer with $H_{afc} \leq 25$ Oe, will, when operated at such competitive current densities, be expected to suffer the aforementioned distortion of their bias magnetization distribution that will inevitably lead to a significant reduction in the usable $\Delta R/R$, as well as loss of linear dynamic range and accompanying increase in nonlinear distortion of the reproduce signal.

Excluding the aforementioned DMR design, conventional MR head designs using either single layer AMR films, GMR spin-valves, or (uniformly biased) GMR multilayers will all require magnetic shield structures with MR-shield gaps of order 1/10 micron in order to obtain adequate linear reproduce resolution for future ultra high density recording systems. In addition to imposing significant technological difficulties such as insuring adequate electrical insulation of the MR head from very closely spaced conductive magnetic shields, such shielding structures also limit design options for biasing the MR element. Regarding the uniformly biased GMR multilayer, the only likely feasible bias technique known in the present art involves sense current self-bias by the inclusion of additional biasing layers, e.g., current shunt and/or magnetically-soft-adjacent-layers. Even for convention AMR films with small anisotropy fields of $H_k \approx 4–5$ Oe, it is well known that these adjacent-layer bias techniques will require ever increasing bias current densities of $>10^7$ amp/cm$^2$ to achieve adequate bias levels as the MR element height is reduced to 1 micron or less to accompany similarly small future reproduce track widths. This can further exacerbate the detrimental effects of the additional antisymmetric self-bias component of GMR multilayers described above. Although the latter problem can be eased, as implied above, by development and use of GMR materials with $H_{afc}$ of order 30–100 Oe, this in turn will add to the level of required current density to achieve adequate (uniform) bias of the shielded GMR multilayer, which then exacerbates internal bias problem, and so forth. The presence of additional biasing layers will in general also lower signal levels due to their electrical shunting of the MR layer(s).

The desirability of achieving a uniform bias state of $\sin\theta \approx 1/2$ in a GMR multilayer is that it is the optimum bias state for maximizing reproduce sensitivity/dynamic range for detecting the symmetric component of any signal field. A brief, limited summary of the difficulties in achieving such a bias state have been outlined above. However, an approximately antisymmetric bias state, such as the internal sense current self-biased state of a GMR multilayer, is similarly optimal for detecting the antisymmetric signal field component $H_{sig-a}(x,y) = [H_{sig}(x,y) - H_{sig}(-x,y)]/2$. At high linear magnetic recording densities, both $H_{sig-s}$ and $H_{sig-a}$ are similar in amplitude, and either one may be detected for the reproduction of information recorded on a magnetic medium. The DMR design, as taught in the above-incorporated '794 and '038 patents, is an example of an antisymmetrically self-biased MR head which exploits an intrinsic sensitivity to $H_{sig-a}$ in order to be able to achieve, without magnetic shields, comparable high density signal levels and superior linear resolution to the most narrow gap shielded MR heads that may be practically fabricated.

SUMMARY OF THE INVENTION

The present invention is aimed at overcoming the recognizable problems of employing GMR multilayer films to replace conventional AMR films in an otherwise conventional shielded-MR reproduce head design for future high density magnetic recording applications.

More particularly, the present invention is directed to a GMR multilayer reproduce head which exploits the internal sense current self-biasing of the GMR multilayer to establish a "GMR-DMR" head, i.e., an unshielded GMR multilayer which is completely self-biased at reasonable current densities, and which achieves the functionally equivalent high density reproduce performance advantages intrinsic to the conventional DMR reproduce head design as taught in the above-incorporated '794 and '038 patents, but with the much greater intrinsic sensitivity offered by the "giant" magnetoresistivity of GMR materials.

Further, the magnetostatic stability of the fully antisymmetrical GMR-DMR bias magnetization state, which is additionally strongly energetically favored by the intrinsic antiferromagnetic interlayer-coupling of GMR multilayers, should obviate the need for complex single-domain-stabilization/Barkausen-noise-suppression means known in the art that are difficult to manufacture, and should make the GMR-DMR structure more naturally suited to the sub-micron sizes (both track width and element height) expected of future ultra high density reproduce heads than any practical alternative MR head design yet known.

Accordingly, a GMR-DMR sensor or reproduce head in accordance with the invention comprises a substrate, a thin film, multilayered structure formed on said substrate, said structure further comprising alternating electrically conducting layers of magnetic and non-magnetic film layers formed such that the magnetic film layers are substantially antiferromagnetic coupling across the sandwiched nonmagnetic film layers, said antiferromagnetic coupling aligning the magnetization vectors of adjacent planar regions of consecutive magnetic film layers to be substantially antiparallel to one another when not subjected to either an external magnetic field or the field induced by current flow therein, said multilayer structure exhibiting a change in resistivity when subjected to an external magnetic field causing the magnetization vectors of said adjacent planar regions of said magnetic film layers to rotate into a substantially more parallel orientation thereby exhibiting a giant magnetoresistive effect, means for producing a current flow through said thin film, multilayer structure, wherein the magnetic fields generated by said current flow maintain a bias magnetization state of said structure in which the net component of magnetization along the axis transverse to that of said current flow of a first set of sandwiched magnetic and nonmagnetic film layers that are formed on one side of the center-most film layer is substantially equal in magnitude and opposite in direction by comparison to that of the net component of magnetization along the axis transverse to that of said current flow of the second set of sandwiched magnetic and nonmagnetic film layers that are formed on the other side of the center-most film layer, whereby the layered structure operates in the fashion of a dual magnetoresistive sensor or reproduce head, and means for sensing the variations of resistivity of said magnetoresistive head in response to an applied magnetic field.

Preferably in the GMR-DMR sensor or reproduce head, both of the outer-most magnetic film layers are formed substantially thinner (approximately 50% thinner) than the relatively uniform thickness, inner magnetic film layers of the multilayer structure in order to reduce self-bias level variance between the outer-most and inner magnetic film layers.

The magnetic and nonmagnetic film layers may be equal or unequal in number but preferably would be formed as two mirror image sets of N magnetic and N-1 nonmagnetic film layers on either side of a center-most nonmagnetic film layer or magnetic film layer. The center-most film layer, particularly the center-most nonmagnetic film layer, may be formed of a greater thickness sufficient to ensure that the net components of magnetization along the axes transverse to that of the current flows of the first and second sets of N sandwiched magnetic and nonmagnetic film layers are equal and opposite.

Advantages of the Invention

The GMR-DMR multilayer is unshielded and completely self-biased at reasonable current densities and achieves the functionally equivalent high density reproduce performance advantages intrinsic to the conventional DMR reproduce head design, but with the much greater intrinsic sensitivity offered by the "giant" magnetoresistivity of GMR materials. The required perpendicular biasing is attained solely by the interaction of the magnetic film layers across the nonmagnetic film layers under the influence of the magnetic fields arising from the flow of the sense current in the GMR-DMR structure. The inherent high resolution of the prior art DMR head is retained in the operation of the GMR-DMR head, and is effectively combined with the high output signal capability provided by GMR behavior of the thin film layers. The GMR-DMR sensor or reproduce head can be advantageously constructed and operated with sub-micron element heights suitable for reproducing ultra high linear denisty recorded tracks widths at or below the one micron range.

BRIEF DESCRIPTION OF THE DRAWINGS

Other objects, advantages and features of the present invention will become apparent from the following specification when taken in conjunction with the accompanying drawings in which like elements are commonly enumerated and in which.

The figures are not necessarily to scale.

DETAILED DESCRIPTION OF THE PREFERRED EMBODIMENTS

Figure 3:
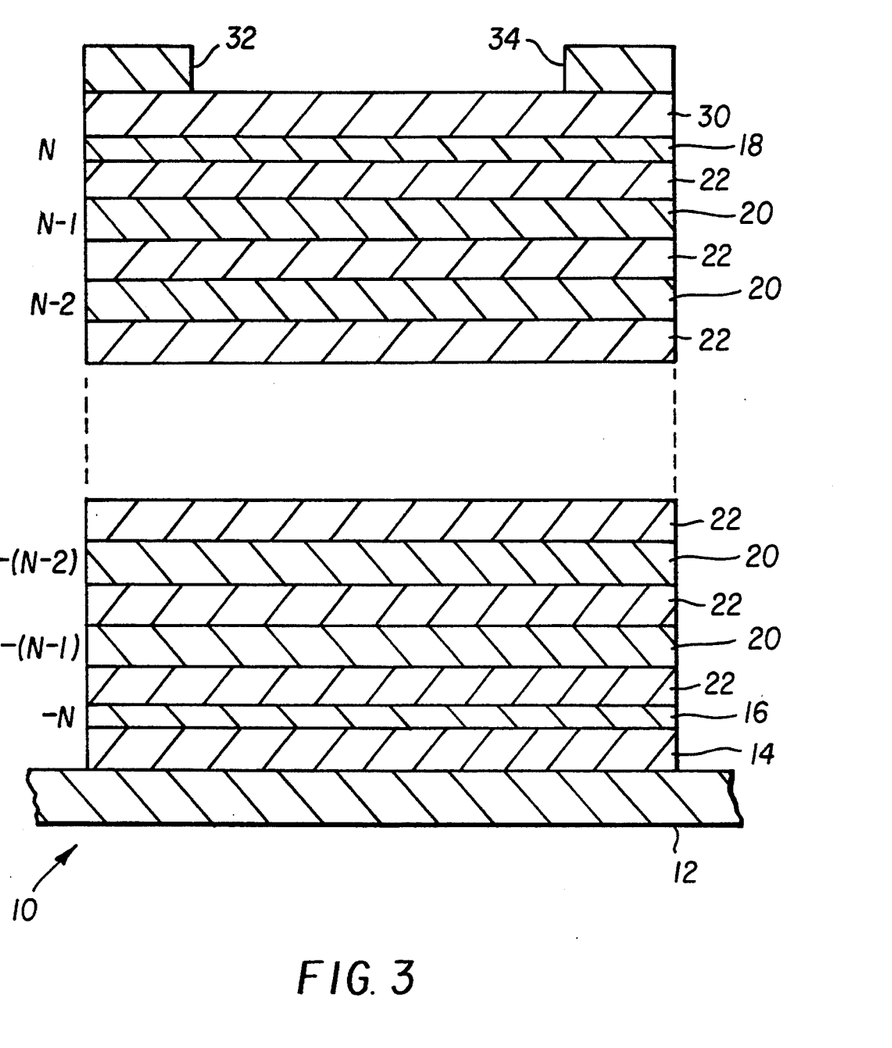
FIG. 3 is a cross-section view of a GMR-DMR reproduce head structure, in accordance with a first embodiment of the invention.

FIG. 3 illustrates a cross-section view of a GMR-DMR reproduce head or sensor structure 10, in accordance with a first embodiment of the invention. On top of substrate 12 (and over a suitable, optional, buffer layer 14) are alternatingly deposited 2N electrically conductive magnetic layers, including outer magnetic layers 16, 18, and interior magnetic layers 20, with 2N−1 nonmagnetic, electrically conducting layers 22. The nonmagnetic conducting layers 22 are nominally of the same composition and thickness, as are all the interior magnetic layers 20. The outer magnetic layers 16 and 18 are nominally of similar composition to interior layers 20, but have approximately one-half the magnetic thickness of layers 20. A conductive passivation layer 30 of preferentially high electrical resistivity is then deposited on top of outer layer 18. Patterned current lead structures 32 and 34 are subsequently deposited atop passivation layer 30 using photolithographic techniques well known in the art.

The composition and thicknesses of the layers are in general chosen to optimize the properties of the GMR-DMR sensor, e.g., maximize the coefficient $\Delta R/R$ consistent with an appropriate magnitude of coupling field strength $H_{afc}$. The magnetic layers 16 and 18 are also labeled "−N" and "N", respectively, and interior magnetic layers 20 are labeled in order extending outward from the central, nonmagnetic conductive layer 24 (shown in FIG. 4). The fabrication of this structure is relatively straightforward, and it requires no additional depositions of bias and/or stabilization layers and essentially only one final masking step in order to form the patterned current lead structures 32, 34.

Figure 4:
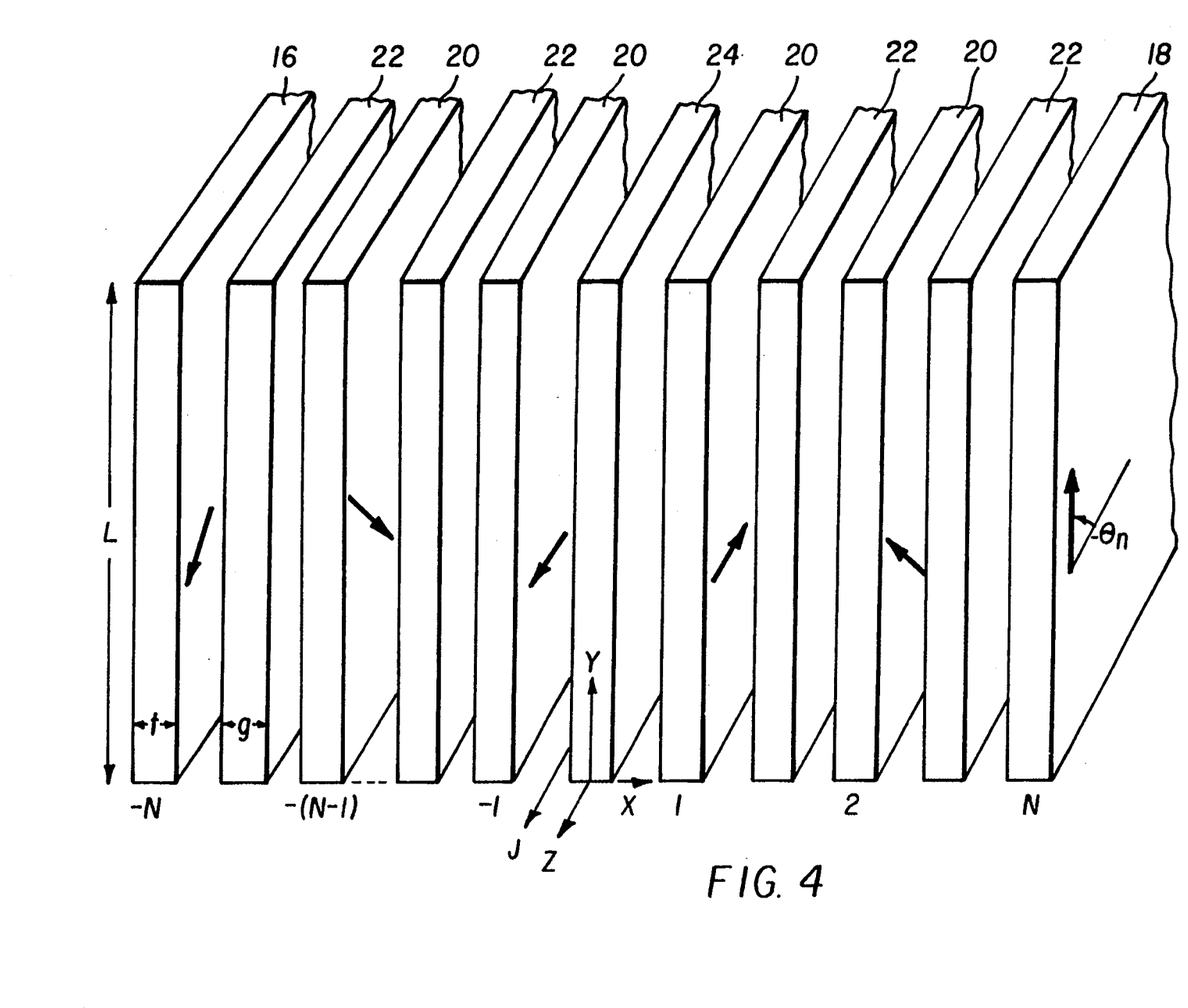
FIG. 4 is an exploded, perspective view in part illustrating a self-biased 2N magnetic layer GMR-DMR multilayer reproduce head, in accordance with the first embodiment of the invention.

FIG. 4 illustrates the basic structure of the GMR-DMR element layers in a partial perspective view, and also defines various geometric and magnetic parameters characteristic of the embodiment, where the number N may be on the order of ten. The substrate 12, buffer layer 14, passivation layer 30 and patterned current lead structures 32, 34 are not shown for simplicity. The center-most non magnetic layer 24 is the starting point for the numbers $1-N$ and $-(1-N)$ appended to the magnetic layers in the multilayer structure. The interior magnetic layers 20 and nonmagnetic layers 22, 24 have thicknesses t and g, respectively, that are typically on the order of about 2 nm. The thicknesses $T_N=t_{-N}$ of the outermost magnetic layers are approximately one half that of the interior magnetic layer 20 thickness t. For high density reproduce heads, the stripe height L of the GMR-DMR sensor structure 10 is about 1 micron.

Magnetic layers 16, 18, 20, are generally deposited in the presence of a magnetic field in order to induce an easy axis of uniaxial magnetic anisotropy longitudinal to the stripe (along the z-axis), with anisotropy strength characterized by an anisotropy field $H_k$ typically about ten Oe or less. The magnetic layers 16, 18, 20, are typically alloys of Fe, Co, and/or Ni, and may possibly consist of bilayers of more than one alloy composition. The nonmagnetic conducting layers 22, 24 are generally deposited of Cu, Au, or Ag or alloys thereof.

In order to estimate the performance and device physics of the GMR-DMR reproduce head described in the embodiment of FIGS. 3 and 4, it is important to have some understanding of the nature of the interlayer coupling between magnetic layers of the GMR multilayer. It is assumed here that the coupling mechanism is predominantly exchange coupling between adjacent magnetic layers. The interaction energy (per unit surface area) is taken to have the form: $K_{afc} \cos(\theta_n - \theta_{n+1}) + K_{bqc} \cos^2(\theta_n - \theta_{n+1})$, from which one defines the "antiferromagnetic coupling field" $H_{afc} \equiv 4K_{afc}/(M_s t)$ and "biquadratic coupling field" $H_{bqc} \equiv 8K_{bqc}/(M_s t)$, where $M_s$ is the saturation magnetization of the magnetic layers. There is currently a growing body of evidence as to the importance of including a biquadratic component to the interlayer exchange coupling equations, and that $H_{bqc}$ can be comparable (or even larger) in magnitude than the antiferromagnetic coupling field $H_{afc}$ which was earlier thought to be alone sufficient to characterize the interlayer exchange interaction.

Figure 5:
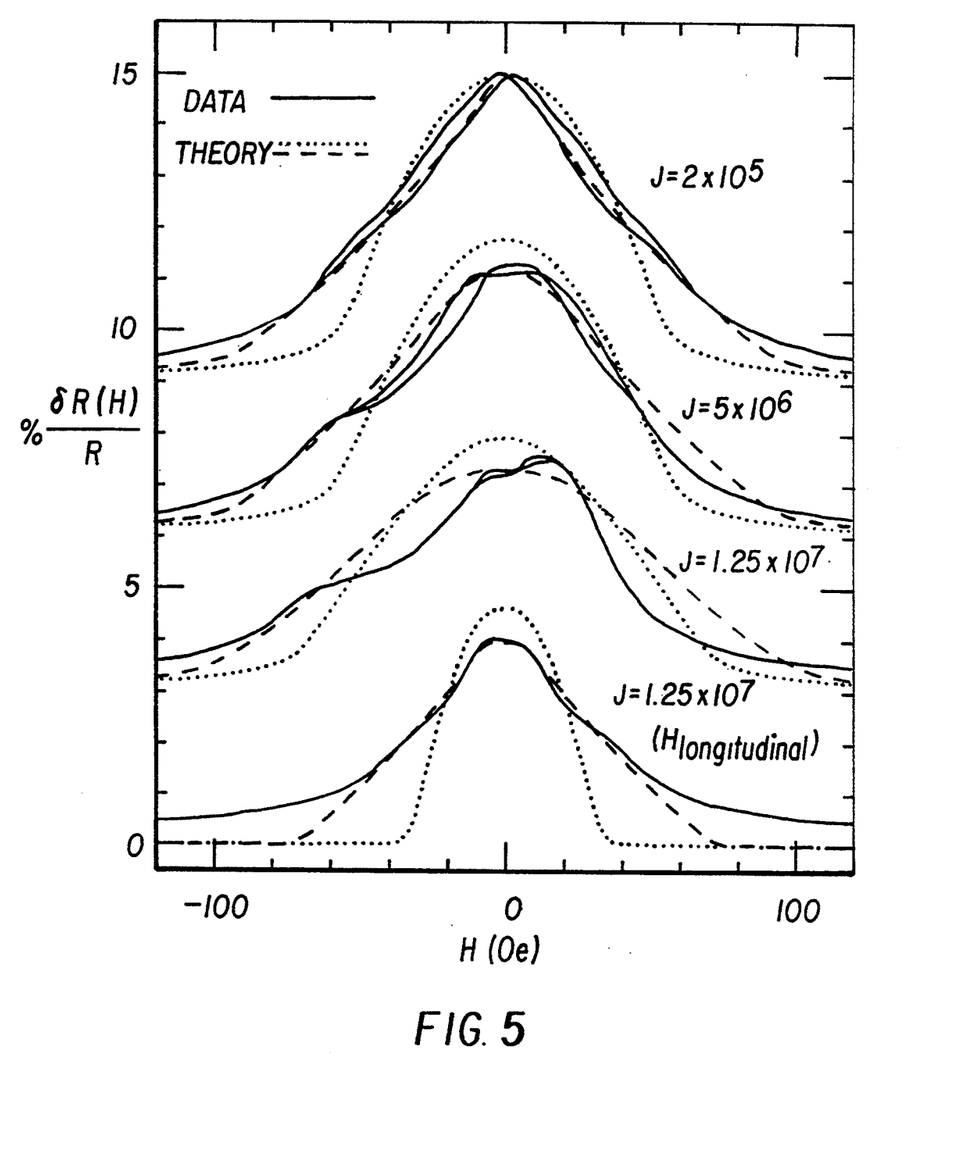
FIG. 5 is a graph depicting experimentally measured R vs. H curves for a 2N=10 layer GMR multilayer subjected to varying sense current densities, along with theoretical simulations.

For example, FIG. 5 shows R vs. H measurements (expressed as the %($\delta R/R$) resistance change for various mean stripe current densities J. The externally applied field H was transverse to the stripe (along y-axis) except in the case of the bottom curve, where H was longitudinal. The experimental results where taken on a 2N=10 layer NiFeCo—Cu GMR multilayer with approximate parameter values $4\pi M_s = 8000$ G, $H_k = 4$ Oe, $t = g = 2$ nm, and L=12 micron provided by the MINT Center of the University of Alabama. The data have been corrected for the reduction in $|\delta R|_{max}/R = \Delta R/R$ due to purely thermal effects (from Joule heating) that were independently measured in a temperature controlled oven. The remaining one third reduction of the observable %($\Delta R/R$), from 6% to 4%, at a current density $J = 1.25 \times 10^7$ amp/cm$^2$ is a direct manifestation of the aforementioned effects of internal sense current self-biasing. This is confirmed by comparison to micromagnetic simulations also shown in FIG. 4. Using $H_{afc} = 40$ Oe (roughly fit to the full-width-at-half-maximum of the low-J data) and assuming $H_{bqc} = 0$ (dotted curves) or $H_{bqc} = H_{afc}$ (dashed curves), theoretical results for the case $H_{bqc} = H_{afc}$ accurately predict the observed reduction in $\Delta R/R$ due to sense current self-biasing for all J values shown.

In particular, the $H_{bqc} = H_{afc}$ simulation also closely matches the "triangular" shape of the low-J $\delta R/R(H)$ curves which is both common to many experimentally studied GMR multilayer systems, and which cannot be explained by the parabolic curve that is theoretically predicted when only antiferromagnetic interlayer coupling is present (i.e., $H_{bqc} = 0$). For the high-J data, the experimental curves show a developing asymmetry about H=0 which is indicative of a asymmetric non-uniformity of film properties through the thickness of the particular GMR sample used in the experiment, and which is not predictable by the theoretical simulation. However, for a longitudinal applied field, the measurement is made insensitive to such a non-uniformity (since H is here perpendicular to the current field $H_J$) and reasonably good agreement between theory and experiment is again obtained when $H_{bqc} = H_{afc}$, with notably poorer agreement when $H_{bqc} = 0$.

Using an analytical approximation to the micro-magnetic model used for the simulations of FIG. 5, one can show, for the structure shown in FIG. 4, that the mean bias level $<\sin\theta_n>$ (where $<>$ denote an average bias level over element height L) in the nth magnetic layer ($-N \leq n \neq 0 \leq N$), due to sense current self-bias can be accurately estimated from solutions of the cubic equation:

$$<\sin\theta_n>[1+(H_{bqc}/H_{sat})(2<\sin\theta_n>^2-1)] = H_{Jn}/H_{sat} (<\sin\theta_n>)<1) \quad (1a)$$

where $$H_{Jn} = sgn(n)(2|n|-1)(g+t)(\pi J/5), (H_{Jn} \text{ in Oe with } J \text{ in amp/cm}^2) \quad (1b)$$

$$H_{sat} = (H_{afc} + H_k)/(1-\epsilon), \epsilon = (2\Lambda/L) \tan h(L/2\Lambda) \quad (1c)$$

$$\Lambda = [(1/10)(2N-1)^2 4\pi M_s tg + 2A/M_s)/(H_{afc} + H_k)]^{\frac{1}{2}} \quad (1d)$$

$$t_N/t = r_N \approx (N-1)/(2N-1)$$
$$[1+N/(2N-1)^2(1+H_k/H_{afc})/(1+g/t)] \quad (1e)$$

and A is the intralayer exchange stiffness of the magnetic layers. Although derived for the case $H_{bqc} \leq H_{afc} + H_k$, Eq. 1 can also give reasonably accurate predictions when $H_{bqc} > H_{afc} + H_k$ under practical conditions of low L (e.g., $\leq 1$ μm) and moderately high J (e.g., $\geq 10^7$ amp/cm$^2$). The restriction of Eq. 1e to multilayers where $t_N/t = r_N \approx (N-1)/(2N-1) \approx \frac{1}{2}$ is made to compensate for the fact that the outermost $\pm$Nth magnetic layers are exchange coupled to only one adjacent magnetic layer, and thus experience only about half of the interlayer exchange torques as do interior magnetic layers. The condition $t_N = r_N t$ quenches out what otherwise (e.g., when $t_N = t$ and $H_{afc} >> H_{sat} - H_{afc}$) could result in oscillations in $<\sin\theta_n>$ vs. n that are not accounted for in Eq. 1a, and which could be detrimental to the operation of a GMR-DMR head. This effect is roughly analogous to properly terminating a coaxial transmission line to quench out reflections.

Like the conventional DMR, a GMR-DMR sensor responds primarily to the antisymmetric component of a transverse signal field $H_{sig-a}(x,y) = [H_{sig}(x,y) - H_{sig}(-x,-y)]/2$. The parameter $\Lambda$ physically represents the GMR-DMR flux-propagation length for signal flux generated by the $H_{sig-a}(x,y)$ from a recorded magnetic medium, and the quantity $\epsilon$ in Eq. 1c approximately represents the linear flux-efficiency of a given GMR-DMR design relative to a maximum possible efficiency $\epsilon = 1$. A plot of flux efficiency $\epsilon$ vs. element height L, for N=5 and 10, $H_{afc} = 20$, 40, and 80 Oe, and otherwise assuming representative parameter values of $4\pi M_s = 10^4$ G, $H_k = 5$ Oe, $t = g = 2$ nm, and $A = 10^{-6}$ erg/cm, is shown in FIG. 5. Because the GMR-DMR bias level $|<\sin\theta_n>|$ is nonuniform with $|n|$ (Eqs. 1.a,b), the choice of J to achieve an optimal bias point will in general be an application-specific compromise to minimize nonlinear distortion from under-bias or over-bias of inner or outer magnetic layers, respectively, as well as achieve adequate signal levels which otherwise scale linearly with J. The "optimal" bias current $J_{opt}$ is likely to be in the range of that which achieves the condition $|<\sin\theta_{n'}>| \simeq 1/\sqrt{2}$, where $2N/3 \leq n' \leq N$. Using Eq. 1a, this criterion inverts to the condition $H_{Jn'} = H_{sat}/\sqrt{2}$, which is both simple and robust from a design standpoint since it is expected to be independent of the value of $H_{bqc}$. Using, for present demonstration purposes, the more conservative choice n'=N, FIG. 7 shows plots of $J_{opt}$ vs. L assuming the same parameter values as were used for FIG. 6.

Figure 6:
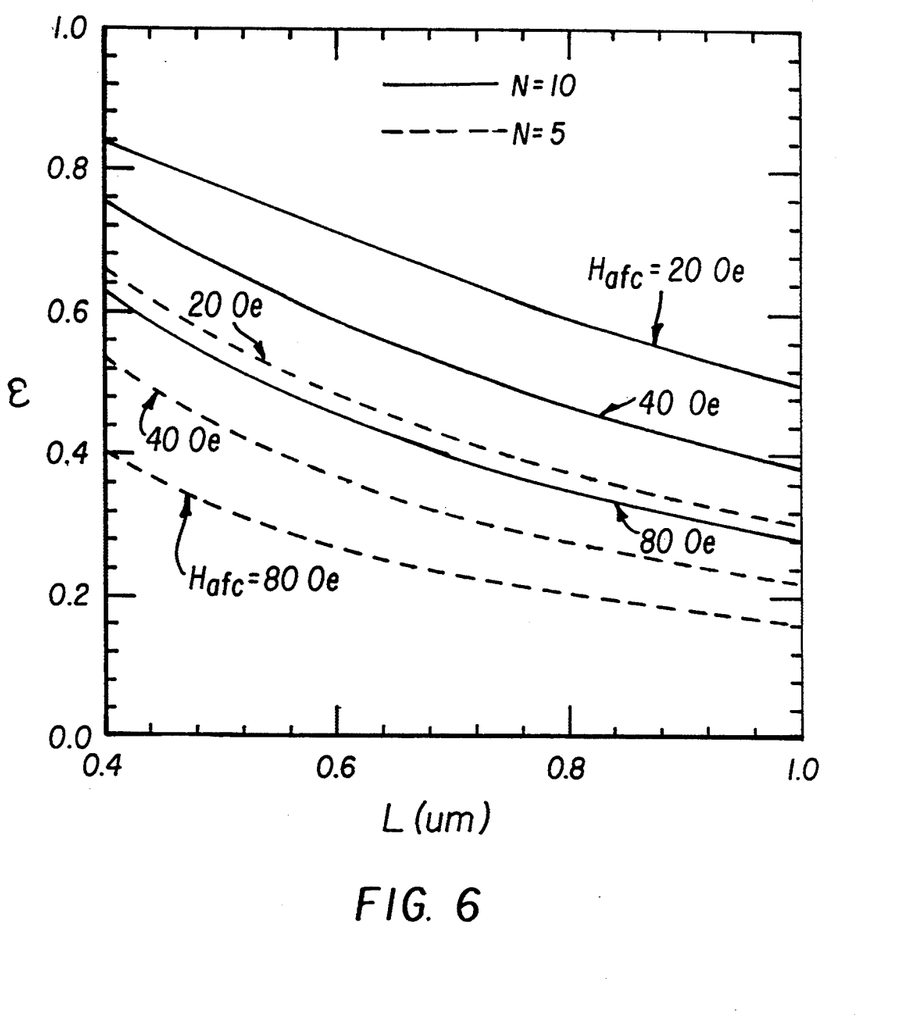
FIG. 6 is a theoretical graph of the relative efficiency of several designs of GMR-DMR heads, vs. GMR-DMR element height L.

Future ultra high density magnetic recording systems (particularly disk systems) will demand submicron reproduce track widths, which in turn will require comparably small (and preferably smaller) element heights for the longitudinal head geometries which are presently the most probable designs for future MR reproduce heads. The results of FIGS. 6 and 7 are indicative to the fact that the GMR-DMR is naturally suited to this sub-micron element height regime, in terms of both achieving decent intrinsic flux efficiencies $\epsilon$ of around 50% or more, and with high, but non-excessively large bias/sense current densities $J_{opt}$ of around $2 \times 10^7$ amp/cm². Further, the magnitude of $J_{opt}$ is less sensitive to element height (for L<1 μm) in comparison to other well known self-biased heads (e.g., soft-adjacent-layer biased MR or conventional DMR), where, in practical designs, $J_{opt} \propto 1/L^2$ at sub-micron L, and where impracticable high values of J approaching $10^8$ amp/cm² may be required to achieve optimal bias, which is then further subject to larger variability due to fabrication tolerances on establishing such small element heights. These GMR-DMR characteristics stem from the physical smallness of the length parameter $\Lambda <<1$ μm (Eq. 1d) in typical cases. While this condition tends to reduce efficiency $\epsilon$, it also makes $J_{opt}$ and $H_{sat}$ less subject to the L-dependent exchange and magnetostatic (shape anisotropy) limitations on bias level amplitude achievable at a given J (Eqs. 1.c,d). Further, the somewhat lower intrinsic flux efficiency of the GMR-DMR in comparison to more conventional designs (with $\epsilon \approx 1$) will usually be in good part compensated for by the lack of electrical shunt loss from the additional non-MR conductive biasing layers generally required of these same alternative MR head designs.

The reproduce signal level and linear resolution of any MR head design may be quantitatively described in terms of the intrinsic spectral response function F(λ) of the head, which can be defined from the relation $\delta R(\lambda)/\Delta R = (M_r\delta/M_s \quad T_M)$ [(1-exp($-2\pi\delta/\lambda$)/($2\pi\delta/\lambda$)]exp($-2\pi d/\lambda$) F (λ), which describes the amplitude of the linearized magnetoresistive response from playback of a sinusoidally recorded magnetic medium. $M_r\delta$ is the amplitude of the recorded magnetic medium's remanence-thickness product, λ is the recorded wavelength, d is the head-medium spacing, and $T_M = (N - \frac{1}{2})$ t is the total magnetic half-thickness of the GMR-DMR. Spectral response function F(λ) is particularly useful for comparative purposes, since it is reflective of a given head's intrinsic reproduce capabilities, independent of details of the medium, head-medium interface, and or the record process.

Figure 7:
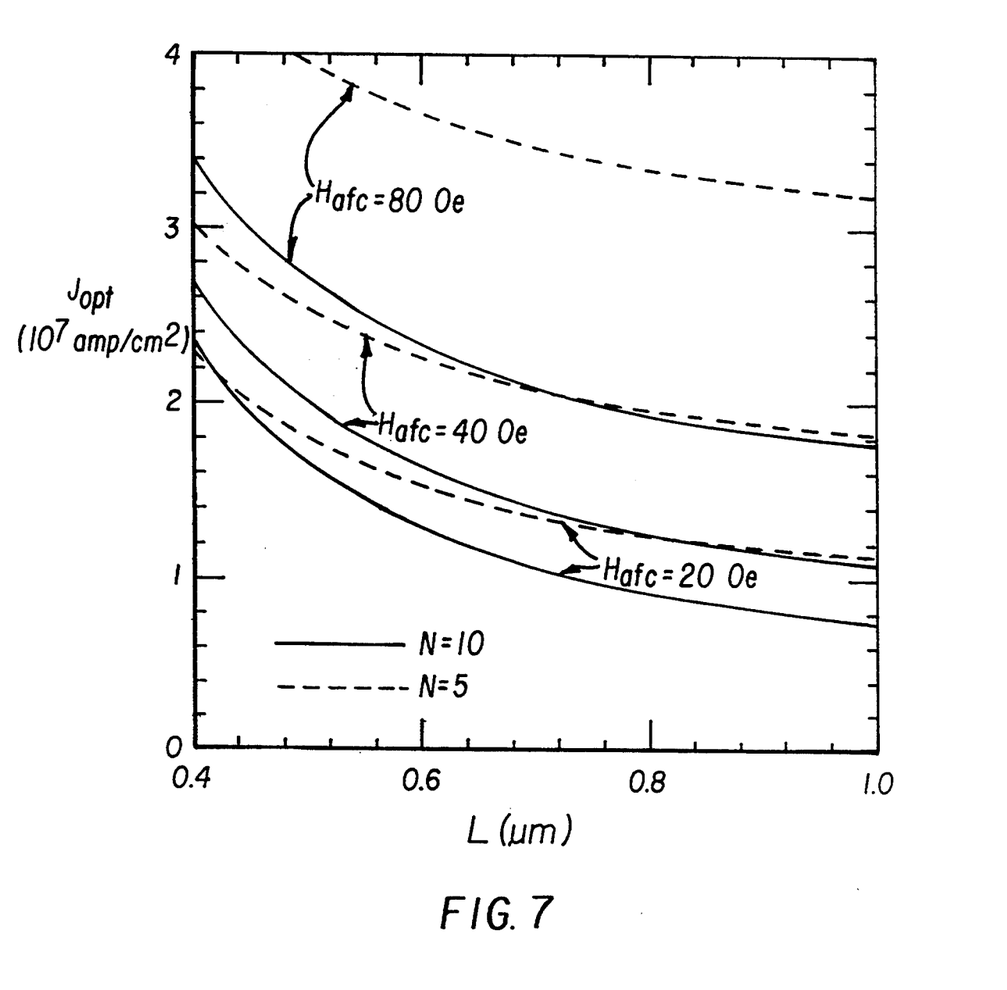
FIG. 7 is a theoretical graph of the sense current density required to achieve approximately optimal bias of several designs of GMR-DMR heads, vs. GMR-DMR element height.

FIG. 7 shows numerical computations of F(λ) for several L=0.7 μm element height GMR-DMR head designs with $H_{afc}$=40 Oe, N=5 or 10, $H_{bqc}$=(0, 1, or 2)×$H_{afc}$, $J_{opt}$=(2.1 or 1.4)×$10^7$ amp/cm² for N=5 or 10, respectively (FIG. 6), and with other parameter values as cited above. The peak values of F(λ) for curves with N=5 are about 56% as large as for N=10, which is in good agreement with the value of 61% predicted from the ratio of relative efficiency shown in FIG. 7. The null observed in F(λ) at λ=G'=0.060 μm for N=10 and $H_{bqc}$=0 shows the effective DMR reproduce gap G' to be reasonable close to the $G' \approx 4N(g+t)/3 = 0.053$ μm that one would in general estimate given the linear bias profile $|<-\sin\theta_n>| \propto 2|n|-1$ predicted in Eq. 1a. (The nonlinear $H_{bqc}$ term in Eq. 1a yields a more uniform bias profile, which reduces the effective G' somewhat.)

Figure 8:
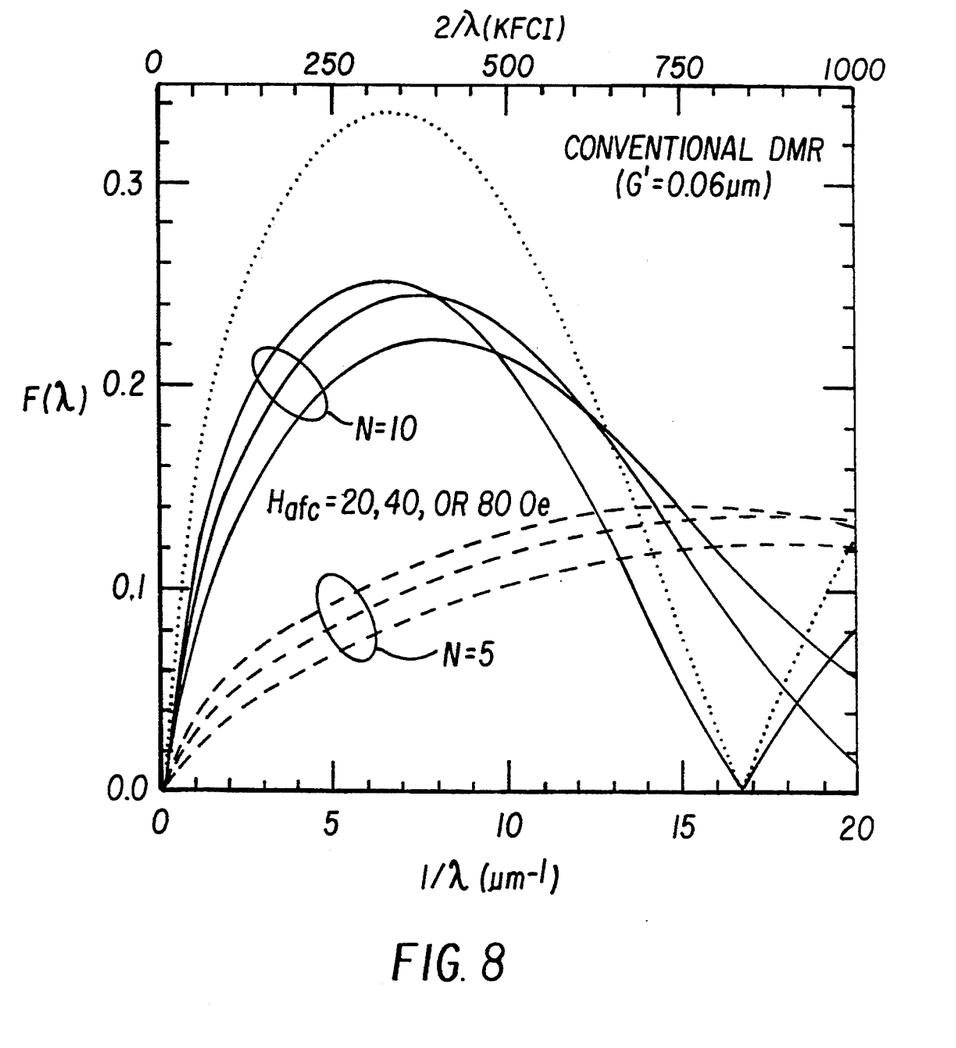
FIG. 8 is a graph of theoretical computations of the intrinsic spectral response function for several designs of GMR-DMR reproduce heads, along with a comparison to that for a conventional DMR with equivalent geometric/magnetic properties.

As was inferred earlier from Eqs. 1, FIG. 8 shows that the reproduce properties of the GMR-DMR (most notably the efficiency, or peak amplitude of F(λ) to be reasonably insensitive to $H_{bqc}$, particularly when $H_{bqc} \leq H_{afc} + H_k$. The latter condition should also help eliminate the possibility of hard axis hysteresis from the nonlinear nature of the biquadratic coupling term, and thus is a more generally desirable criterion for the future development of practical GMR multilayer materials. As was shown in FIG. 5, the presence of a moderate degree biquadratic coupling can also beneficially serve to "linearize" the intrinsic R(H) response curve (i.e., make the slope dR/dH less bias-point dependent), and thereby reduce the well known even order distortion from the parabolic R(H) common to AMR or GMR with $H_{bqc}$=0. This can be particularly beneficial to the GMR-DMR design, where the aforementioned non-uniformity in bias level precludes simultaneously having all magnetic layers individually biased to an optimum bias point.

FIG. 8 also shows a comparison with F(λ) for a conventional AMR-DMR with the same values of $4\pi M_s$, $H_k$, $T_M$, and G' as for the N=10, $H_{bqc}$=0, GMR-DMR structure, and which is biased to the equivalent mean bias level of $|\langle\sin\theta\rangle| = \frac{1}{2} (|<\sin\theta_N>|=1/\sqrt{2})=0.354$. The AMR-DMR result was computed using the analytical equations described by Smith et al., *IEEE Trans. Magn.*, vol. 28, pp. 2295–2297, 1992. Although 25% lower in relative efficiency, the spectral shape of F(λ) for the GMR-DMR structure is virtually identical to the equivalent AMR-DMR head, indicating their functional equivalence regarding the underlying device magnetics that yields the high sensitivity and unsurpassed intrinsic linear resolution of the DMR design, as taught in the above-incorporated '038 patent. When further accounting for the fact that GMR multilayers of similar magnetic characteristics to that assumed above, with $\Delta R/R \approx 10\%$, have already been made in the laboratory (e.g., the case shown in FIG. 5), and with expected improvements in the future, the GMR-DMR reproduce head potentially offers an order of magnitude improvement in reproduce sensitivity over the conventional AMR-DMR reproduce head for ultra high density magnetic recording applications.

The GMR-DMR reproduce head also offers additional benefits, not included in the above descriptions, which become very important in small t° rack width MR reproduce heads where the three-dimensional effects of anisotropic signal flux propagation (via magnetization rotation) through the active area of an MR head become important. Firstly, because adjacent magnetic layers in either half of the self-biased GMR-DMR are magnetized at approximately supplementary angles, i.e., $\theta_n + \theta_{n+1} \approx \pi$ for N>>1 (see FIG. 4), the axes of rotational flux propagation (oriented at angle $\theta_n \pm \pi/2$) of adjacent pairs of magnetic layers will propagate the signal flux (up from the medium, through the active area of the MR element) equally well from either side of the recorded track, thereby eliminating the well known and undesirable asymmetry in the cross track profile of a single, narrow-track MR element.

Secondly, because the dual pair of nth magnetic layers in opposite halves of the self-biased GMR-DMR are magnetized antiparallel, i.e., $\theta_{-n} = \theta_n \pm \pi$, their axes of rotational flux propagation are necessarily parallel. In this circumstance, each dual pair individually (or collectively for all odd, or even n) constitute a fully antisymmetric, or "A-DMR", bias configuration, in which dual pairs form a minimum reluctance, closed loop flux return path for the signal flux generated by the antisymmetric component $H_{sig-a}$ of the recorded medium's signal field.

As was taught in the above-referenced '563 application, and further elaborated by Smith et. al., *IEEE Trans. Magn.*, vol. 29, March 1994, the A-DMR configuration is not only key to maximizing narrow-track reproduce sensitivity, but crucially important to provide the common mode rejection of longitudinal signal fields needed minimize adjacent track cross-talk interference and on-track signal distortion due to mistracking. The vanishing of the slope $d(\delta R)/dH$ about $H=0$ in the bottom curve in FIG. 5 is a demonstration of such common mode rejection of longitudinal fields. Unlike the conventional DMR, in which difficult to fabricate means would likely be required to initialize and stabilize the A-DMR bias state, the antiferromagnetic nature of the interlayer exchange coupling intrinsic to GMR multilayers should automatically and optimally serve precisely this function at zero additional cost or complexity.

The effective reproduce gap $G'=0.06$ μm from the GMR-DMR example of FIG. 8, is probably already beyond practical linear resolution limits of conventional shielded MR designs (using AMR or GMR), due to the need to electrically insulate the MR element from conductive magnetic shield structures located a distance $\leq G'$ from the MR and/or its current lead structures. The GMR-DMR reproduce gap, $G' \simeq 4N(g+t)/3$, can readily be reduced as small as necessary to meet any foreseeable linear resolution requirements at ultra high linear recording densities of the future. Because the thicknesses t, and especially g, will likely be chosen to optimize $\Delta R/R$, $H_{afc}$, and/or other intrinsic properties of a GMR multilayer material, layer number N is likely to be the design parameter available for adjustment to optimize G' in the embodiment of FIGS. 3 and 4.

Figure 9:
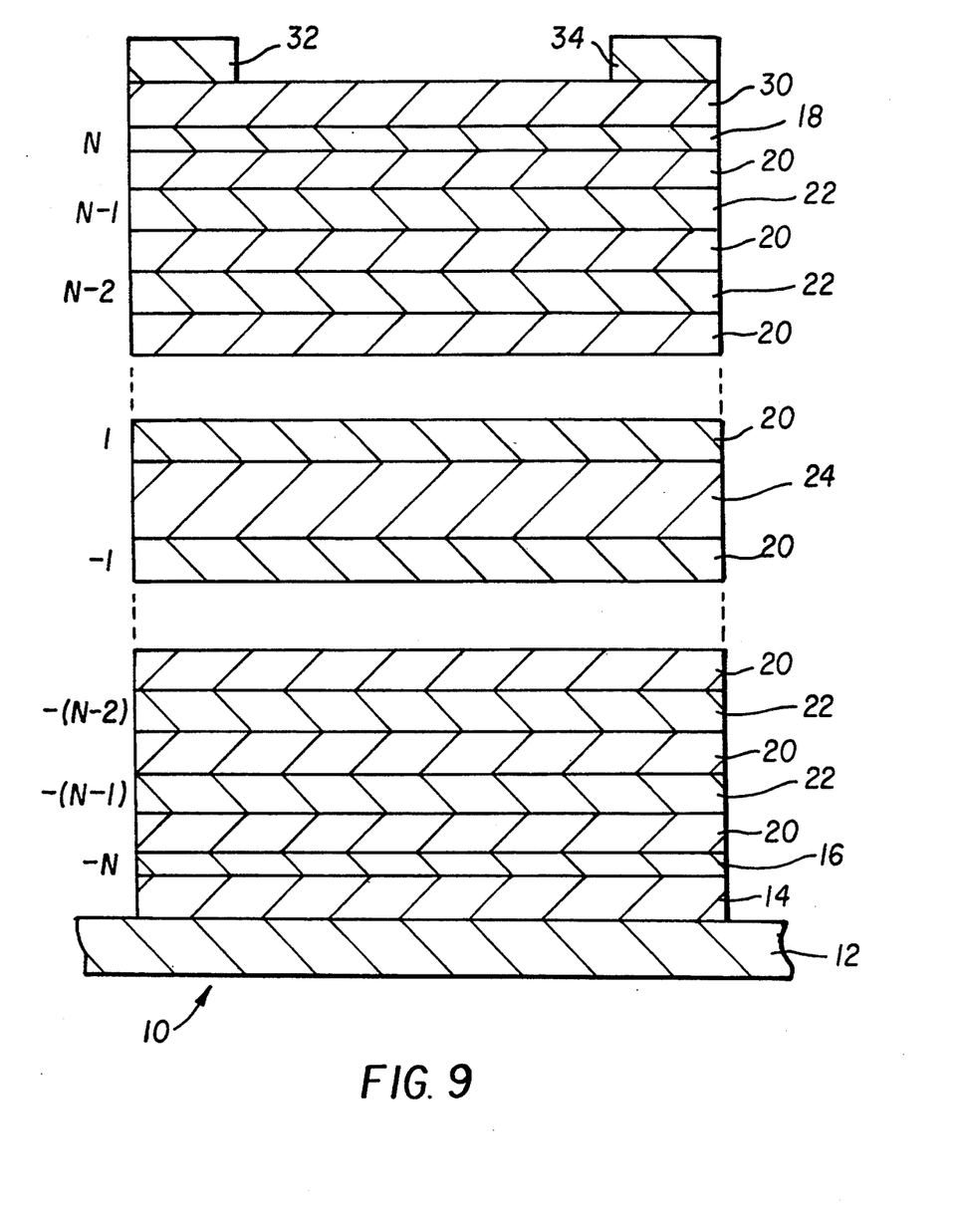
FIG. 9 is a cross-sectional view of a further alternative embodiment of the present invention.

The alternative GMR-DMR embodiment shown in FIG. 9 would allow some additional flexibility to design the reproduce gap G' more independently from the effective magnetic thickness $T_M \simeq Nt$, which is more optimally chosen in accordance with the recording medium so to maintain a value of $(M_r\delta/M_sT_M)$ consistent with adequate signal levels at sufficiently low non-linear distortion. The alternative embodiment of FIG. 9 is essentially the same as shown in FIGS. 3 and 4, with the exception that the central, nonmagnetic, conductive layer 24 has a thickness $g_0>g$. The thicker central conductive layer 24 may be made of the same material as the other nonmagnetic conducting layers, or if $g_0>>g$, from an alternative higher electrical resistivity material to minimize the necessary signal loss from electrical shunting by a "thick" central conductor. In this latter case, the exchange coupling between the $N=\pm 1$ magnetic layers will be eliminated, and magnetostatic coupling between opposite halves of the GMR-DMR structure will be weakened. Consequently, a minimum shunt current down the central conductive layer 24 may be also necessary to maintain unipolarity of $<\sin\theta_n>$ in each half of the multilayer on opposite sides of layer 24. It would also be necessary to establish that the desirable properties of the second half GMR multilayer deposited on top of the material of layer 24 are maintained, and that they be approximately equivalent to that of the first half deposited earlier. The latter condition may be aided by using a buffer layer 14 of similar composition to central, nonmagnetic conductive layer 24. The centermost nonmagnetic film layer 24 is preferably of a greater electrical resistivity than the remaining nonmagnetic film layers 22.

Figure 10:
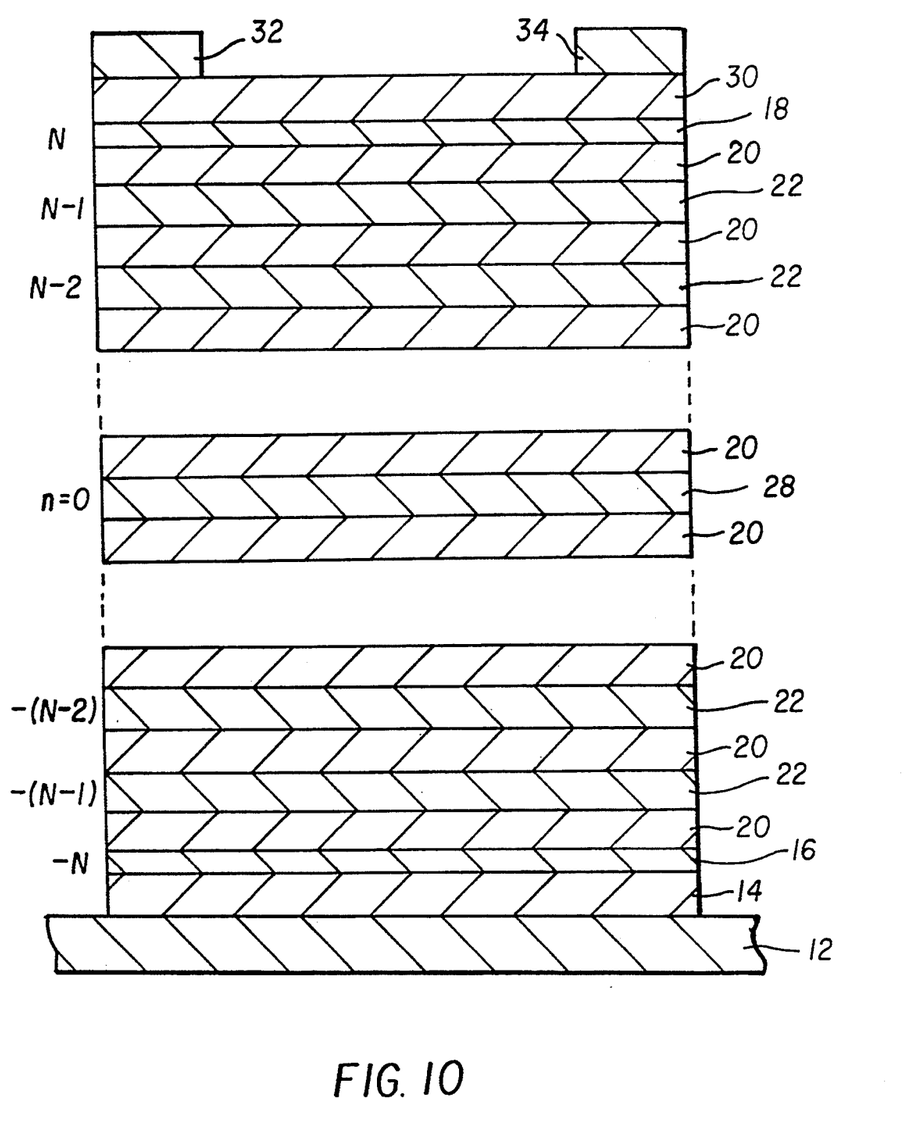
FIG. 10 is a cross-sectional view of a still further alternative embodiment of the present invention.

In yet another alternative embodiment, shown in FIG. 10, there are 2N nonmagnetic conducting layers 22, and 2N+1 magnetic layers 16, 18, 20, including a central magnetic layer 28. In this embodiment, the central magnetic layer 28 is chosen to be an $n=0$ magnetic layer with thickness $t_0>t$, which maintains (possibly modified in strength or form) exchange coupling between adjacent $n=\pm 1$ magnetic layers. Remaining unbiased by $H_J$ (i.e., $<\sin\theta_0> \simeq 0$), a central magnetic layer 28 can also be useful in stabilizing an antisymmetric bias state $<\sin\theta_{-n}> = -<\sin\theta_n>$ (and particularly $<\sin\theta_{-1}> = -<\sin\theta_1>$) in cases where $H_{bqc}>H_{afc}+H_k$. However, in this, or possibly in the preceding alternative embodiment, the bias angles will now satisfy the condition $\theta_n + \theta_{-n}=0$, and not the true A-DMR bias condition described above. Nonetheless, for large $N>>1$, $\theta_n + \theta_{n+1} \simeq \pi$, which means that $\theta_{-n} \simeq \theta_{n+1} + \pi$, and the odd n layers of one half of the multilayer can form dual "A-DMR" pairs with the even n layers from the other half (and visa-versa), and a close approximation to the optimal A-DMR state will still be maintained.

Hence, from the multiple viewpoints of self-bias capability at sub-micron element heights, with high, but nonextreme optimal sense current densities (i.e., $J_{opt} \leq 3 \times 10^8$ amp/cm$^2$) with reasonable element height tolerance, with "built-in" stability of the optimum bias configuration state at no additional cost in fabrication complexity or signal loss, with high sensitivity ($\epsilon \geq 50\%$, and $\Delta R/R \approx 10\%$) and unsurpassed linear resolution capability, the GMR-DMR reproduce head is potentially uniquely better suited for future ultra high density magnetic disk recording applications at sub-micron element heights and track widths than any currently known alternative MR head designs.

Regardless of the specific details of how the GMR-DMR structure is fabricated or processed, or the origin of the interlayer antiferromagnetic coupling (exchange or magnetostatic), the essential DMR-like self-biasing characteristics should remain valid for GMR films with continuous or noncontinuous film layers and/or randomly oriented anisotropy similar to those described in the above-referenced Hylton et al. article.

Other possible alternative designs to improve bias uniformity (across either half thickness), including variable thickness magnetic layers and/or conductor layers to intentionally vary $H_{afc}$(or to make it uniform) across the thickness of the layers, as well as changing the direction of induced anisotropy, are also within the scope of the present invention.

The invention has been described in detail with particular reference to preferred embodiments thereof, but it will be understood that variations and modifications can be effected within the spirit and scope of the invention.

PARTS LIST FOR FIGS. 1–10

GMR-DMR reproduce head or sensor structure 10
substrate 12
buffer layer 14 outer magnetic, conducting layers 16, 18
interior magnetic, conducting layers 20
nonmagnetic electrically conducting layers 22
central, nonmagnetic, conductive layer 24
buffer layer 26
central magnetic layer 28
conductive passivation layer 30
patterned current lead structures 32, 34

What is claimed is:

1. A magnetoresistive sensor or reproduce head comprising:
   a substrate;
   a thin film, multilayered structure formed on said substrate, said structure further comprising alternating electrically conducting, magnetic film layers and non-magnetic film layers formed such that the magnetic film layers are substantially antiferromagnetically coupled across the sandwiched nonmagnetic film layers, said antiferromagnetic coupling aligning the magnetization vectors of adjacent consecutive magnetic film layers to be substantially antiparallel to one another when not subjected to any external magnetic field, or the internal magnetic field induce by current flow therein, said multilayer structure exhibiting a change in resistivity when subjected to an external magnetic field causing the magnetization vectors of said adjacent magnetic film layers to rotate into a substantially more parallel orientation thereby exhibiting a giant magnetoresistive effect;
   means for producing a current flow through said thin film, multilayer structure, wherein the magnetic fields generated by said current flow maintain a magnetization state of said structure in which the net component of magnetization along the axis transverse to that of said current flow of a first set of sandwiched magnetic film layers that are formed on one side of approximately the center-most nonmagnetic film layer is substantially equal in magnitude and opposite in direction by comparison to that of the net component of magnetization along the axis transverse to that of said current flow of the second set of sandwiched magnetic film layers that are formed on the other side of the center-most film layer, whereby the multilayered structure operates in the fashion of a dual magnetoresistive sensor or reproduce head;
   means for sensing the variations of resistivity of said magnetoresistive head in response to an applied magnetic field.

2. The magnetoresistive sensor or reproduce head of claim 1 wherein both of the outer-most magnetic film layers are formed substantially thinner than the relatively uniform thickness, inner magnetic film layers of the multilayer structure.

3. The magnetoresistive sensor or reproduce head of claim 2 wherein both of the outer-most magnetic film layers are formed to have one-half the magnetization-thickness product relative to that of the nominally uniform magnetization-thickness product of the inner magnetic film layers of the multilayer structure.

4. The magnetoresistive sensor or reproduce head of claim 2 wherein said magnetic film layers are fabricated from the group consisting of Co, Fe, Ni and alloys thereof.

5. The magnetoresistive sensor or reproduce head of claim 4 wherein said nonmagnetic film layers are fabricated from the group consisting of Au, Ag, Cu.

6. The magnetoresistive sensor or reproduce head of claim 5 wherein the two outer-most magnetic film layers of the first and second sets have a thickness in the range of about 5 to 20 Angstroms whereas the remaining magnetic film layers have a thickness in the range of about 10 to 40 Angstroms.

7. The magnetoresistive sensor or reproduce head of claim 6 wherein said center-most film layer is of a nonmagnetic material fabricated of a greater thickness than the remaining nonmagnetic film layers which are fabricated having a relatively uniform thickness and with preferably a greater electrical resistivity than the remaining nonmagnetic film layers.

8. The magnetoresistive sensor or reproduce head of claim 2 wherein the two outer-most magnetic film layers of the first and second sets have a thickness in the range of about 5 to 20 Angstroms whereas the remaining inner magnetic film layers have a thickness in the range of about 10 to 40 Angstroms.

9. The magnetoresistive sensor or reproduce head of claim 2 wherein said center-most film layer is of a nonmagnetic material fabricated of a greater thickness than the remaining nonmagnetic film layers which are fabricated having a relatively uniform thickness and with preferably a greater electrical resistivity than the remaining nonmagnetic film layers.

10. The magnetoresistive sensor or reproduce head of claim 9 wherein the two outer-most magnetic film layers of the first and second sets have a thickness in the range of about 5 to 20 Angstroms whereas the remaining inner magnetic film layers have a thickness in the range of about 10 to 40 Angstroms.

11. The magnetoresistive sensor or reproduce head of claim 1 wherein said magnetic film layers are fabricated from the group consisting of Co, Fe, Ni and alloys thereof.

12. The magnetoresistive sensor or reproduce head of claim 11 wherein said nonmagnetic film layers are fabricated from the group consisting of Au, Ag, Cu.

13. The magnetoresistive sensor or reproduce head of claim 1, wherein the magnetic and nonmagnetic film layers have specified thicknesses, widths and heights and the specified heights are in the range of 0.4–1.0 microns.

14. The magnetoresistive sensor or reproduce head of claim 1, wherein the multilayered structure is formed of 2N magnetic and 2N−1 nonmagnetic film layers, whereby the center-most layer is a nonmagnetic film layer.

15. The magnetoresistive sensor or reproduce head of claim 14 wherein said center-most film layer is of a nonmagnetic material fabricated of a greater thickness than the remaining nonmagnetic film layers which are fabricated having a relatively uniform thickness and with preferably a greater electrical resistivity than the remaining nonmagnetic film layers.

16. The magnetoresistive sensor or reproduce head of claim 14 wherein the two outer-most magnetic film layers of the first and second sets have a thickness in the range of about 5 to 20 Angstroms whereas the remaining inner magnetic film layers have a thickness in the range of about 10 to 40 Angstroms.

17. The magnetoresistive sensor or reproduce head of claim 1, wherein the multilayered structure is formed of 2N+1 magnetic and 2N nonmagnetic film layers, whereby the center-most layer is a magnetic film layer.

* * * * *

UNITED STATES PATENT AND TRADEMARK OFFICE
CERTIFICATE OF CORRECTION

PATENT NO. : 5,442,508
DATED : August 15, 1995
INVENTOR(S) : Neil Smith

It is certified that error appears in the above-indentified patent and that said Letters Patent is hereby corrected as shown below:

Column 9, line 44 has a missing closed parenthesis in the numerator of the bracketed expression. The correct formula within the brackets should read as follows:

-- $[(1-\exp(-2\pi\delta/\lambda))/(2\pi\delta/\lambda)]$ --

Signed and Sealed this

Seventh Day of November, 1995

Attest:

BRUCE LEHMAN

Attesting Officer    Commissioner of Patents and Trademarks